United States Patent
Gelzer et al.

[11] Patent Number: 5,210,424
[45] Date of Patent: May 11, 1993

[54] COOLING MEANS FOR COMPONENTS IN A VACUUM CHAMBER

[75] Inventors: Friedbert Gelzer; Volker Wuerttenberger, both of Augsburg, Fed. Rep. of Germany

[73] Assignee: Siemens Nixdorf Informationssysteme AG, Fed. Rep. of Germany

[21] Appl. No.: 805,637

[22] Filed: Dec. 12, 1991

[30] Foreign Application Priority Data

Dec. 20, 1990 [DE] Fed. Rep. of Germany ....... 4041029

[51] Int. Cl.⁵ ............................................. G21K 5/08
[52] U.S. Cl. .................................. 250/443.1; 250/310
[58] Field of Search ................. 250/443.1, 306, 440.1, 250/310

[56] References Cited

U.S. PATENT DOCUMENTS 3,761,709 9/1973 Hasegawa et al. ............... 250/443.1
5,047,637 9/1991 Toda ................................. 250/443.1

FOREIGN PATENT DOCUMENTS 0144843 6/1990 Japan ............................. 250/443.1

Primary Examiner—Jack I. Berman
Assistant Examiner—James Beyer

[57] ABSTRACT

A cooling means is provided for components situated in a vacuum chamber for function testing with focused electron or ion beams. In traditional arrangements, cooling is accomplished with a liquid-cooled metal block that is mounted in the vacuum chamber between the component and an opto-electronic column that generates the electron beam. Coolant is conducted toward the outside of the vacuum chamber via hoses. What is disadvantageous with this solution is the necessity of introducing flow-traversed tubes into the vacuum chamber. Moreover, this solution cannot be realized for components in TAB mounting. In order to avoid these disadvantages, a heat sink is introduced into the vacuum chamber via a sealed opening situated at an upper side of the vacuum chamber. This heat sink is directly contacted to a back side of the component.

6 Claims, 3 Drawing Sheets

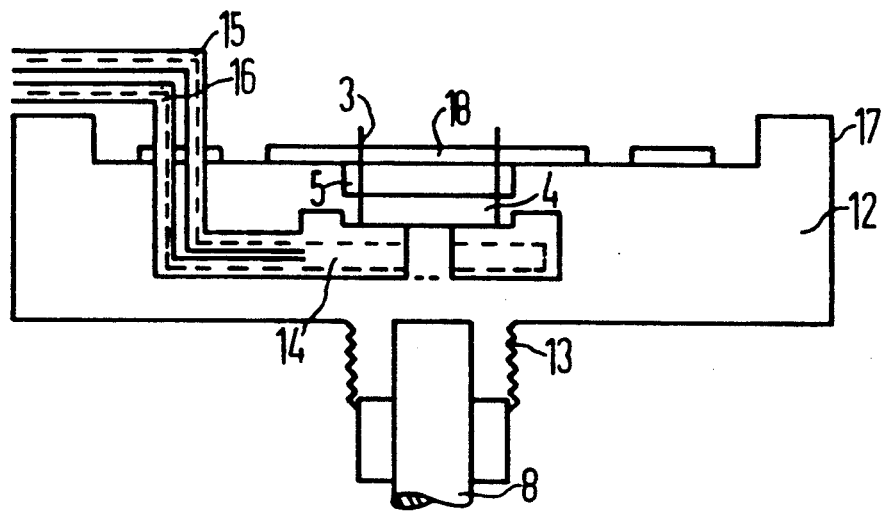
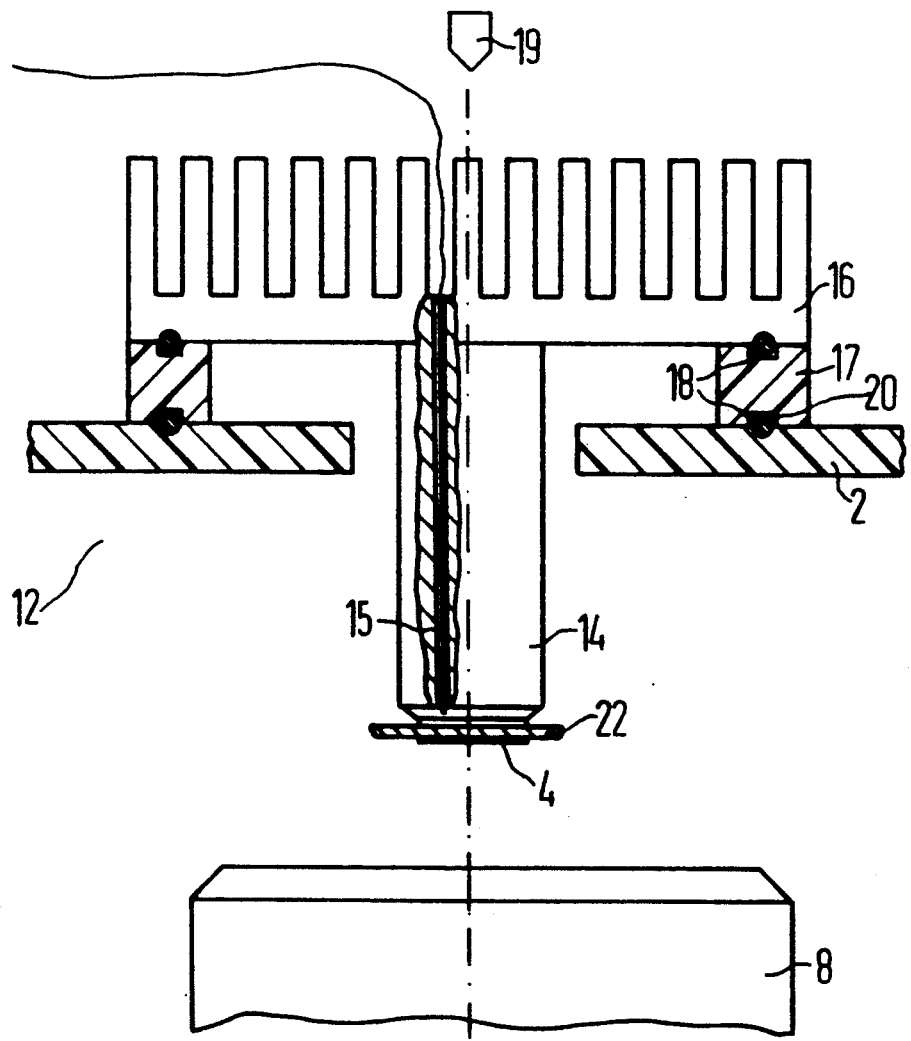

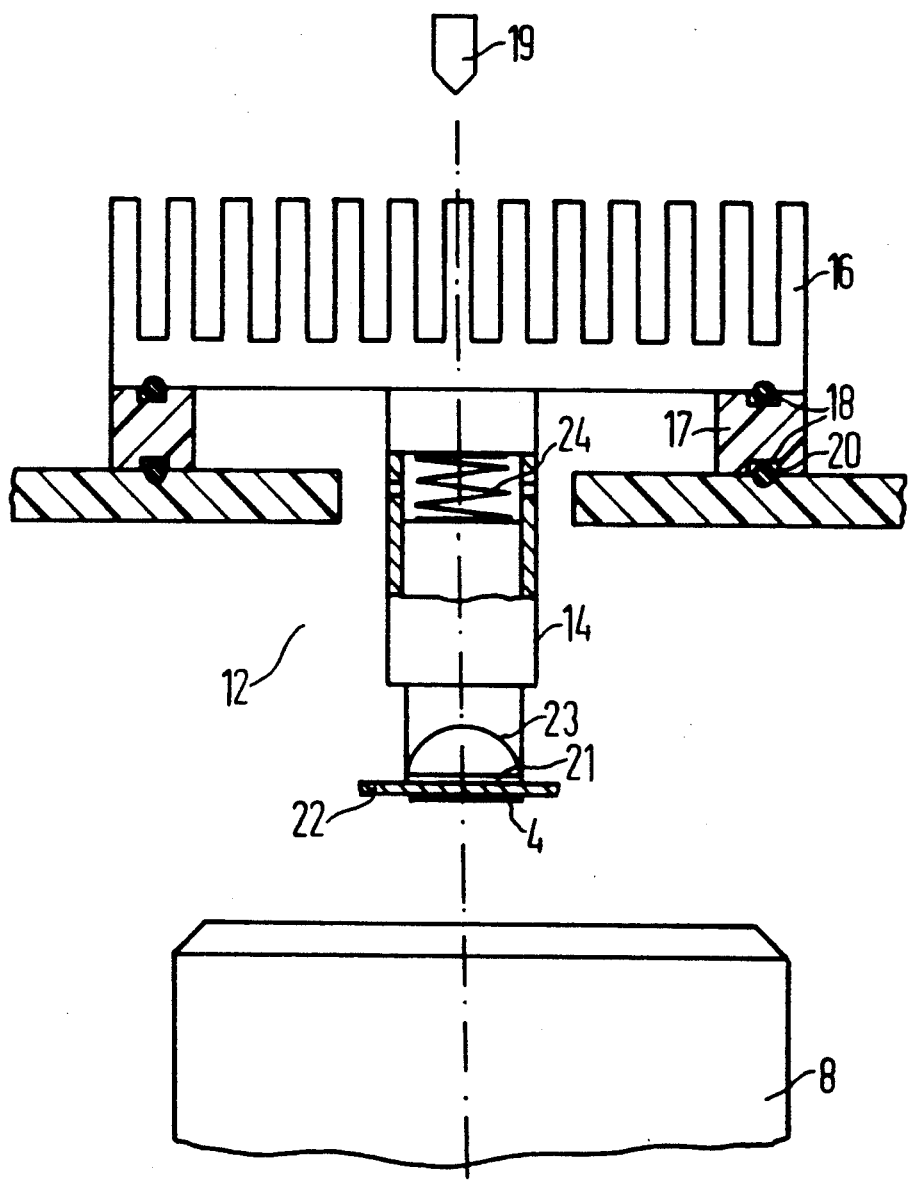

COOLING MEANS FOR COMPONENTS IN A VACUUM CHAMBER

BACKGROUND OF THE INVENTION

The invention is directed to a cooling means for components that are situated in a vacuum chamber for the purpose of function testing with focused electron or ion beams.

For the purpose of an internal analysis, electronic components are electrically operated in the evacuated testing chamber in electron beam measuring instruments, scanning electron microscopes, or focused ion beam apparatus.

Such an electron beam measuring instrument is described in the brochure of the Schlumberger Company "Technologies IDS 4000 Integrated Diagnostics System", August 1988, incorporated herein, with which it is possible to quickly and precisely identify faults in integrated circuits or printed circuit boards.

Its fundamental structure is shown in FIG. 1. The vertically arranged opto-electronic column 8 that generates the electron beam is held at a receptacle frame 9 that simultaneously contains an adjustment system 7 that allows a displacement of the column 8 in the horizontal XY-plane. The overall apparatus is situated in a cabinet that is part of a work station which is covered with a work plate 10. The unit 4 under test is situated in the inside of a vacuum chamber 12 that is accessible via the cover hood 2 that projects from the work plate 10. A mount 5 for the acceptance of the unit 4 under test is attached to the upper inside of the cover hood and the individual contacts of this mount are conducted in vacuum-tight fashion to the outside of the cover hood 2 by terminal pins 3. The opto-electronic column projects into the vacuum chamber 12 sealed with a bellows 13.

The heat arising due to the dissipated power can be eliminated from the chamber only by thermal conduction. Specifically given bipolar circuits having their dissipated powers up to 40 Watts, a considerable difference between junction temperature and ambient temperature arises, this making it more difficult to control the chip temperature.

The solution according to FIG. 2 and described in the afore-mentioned brochure shows a liquid-cooled metal block 14 that is mounted in the vacuum chamber 12 at the unit 4 under test and the opto-electronic column 8. The coolant is conducted toward the outside from the vacuum chamber 12 via hoses 15, 16.

The heat elimination occurs over the housing material that resides next to the active chip surface. In addition to the preparation problems that thus particularly arise for plastic-housed components, the heat transmission resistance of this solution is also relatively high. This solution cannot be realized at all for components in TAB mounting (tape automatic bonding). What is also disadvantageous about this solution is the necessity of introducing flow-traversed tubes into the vacuum chamber.

SUMMARY OF THE INVENTION

It is therefore an object of the present invention to specify a cooling means with which the afore-mentioned disadvantages are avoided.

For achieving this object, the cooling means of the invention is designed such that a heat sink designed in die-like fashion is introduced into the vacuum chamber via a sealed opening at the upper side of the vacuum chamber, and is directly contacted to the back side of the component.

A large contacting area and a short distance between active chip side and heat sink are achieved by these techniques, which provide a low heat transmission resistance.

In a further development, the heat sink is connected outside the vacuum chamber to a cooling rib that is secured on the cover hood of the vacuum chamber. The elimination of the heat at the cooling ribs occurs via temperature-controlled cooling air supplied to them, whereby the actual value of the temperature control is generated by a temperature regulator that, through a bore in the cooling member, is brought directly against the surface of the component to be cooled.

The sealing of the heat sink vis-a-vis the vacuum chamber occurs via an electrically insulating ring that contains grooves at its upper side and lower side into which seals are introduced.

In a further development of the invention, the heat sink can be adjustable in height and incline vis-a-vis the contact surface with the component.

It is thereby expedient that the adjustability of the end face of the heat sink occurs via a socket joint. The adjustability of the height of the cooling member is assured by resilient connections in the inside of the cooling member.

BRIEF DESCRIPTION OF THE DRAWINGS

FIG. 2 is an illustration of a portion of an electron beam measuring instrument having a liquid cooled metal block according to the prior art;

FIG. 3 is a portion of an electron beam measuring instrument having a temperature-controlled heat sink; and FIG. 4 is a portion of an electron beam measuring instrument having a height-adjustable and incline-adjustable heat sink.

DESCRIPTION OF THE PREFERRED EMBODIMENTS

Figure 1:
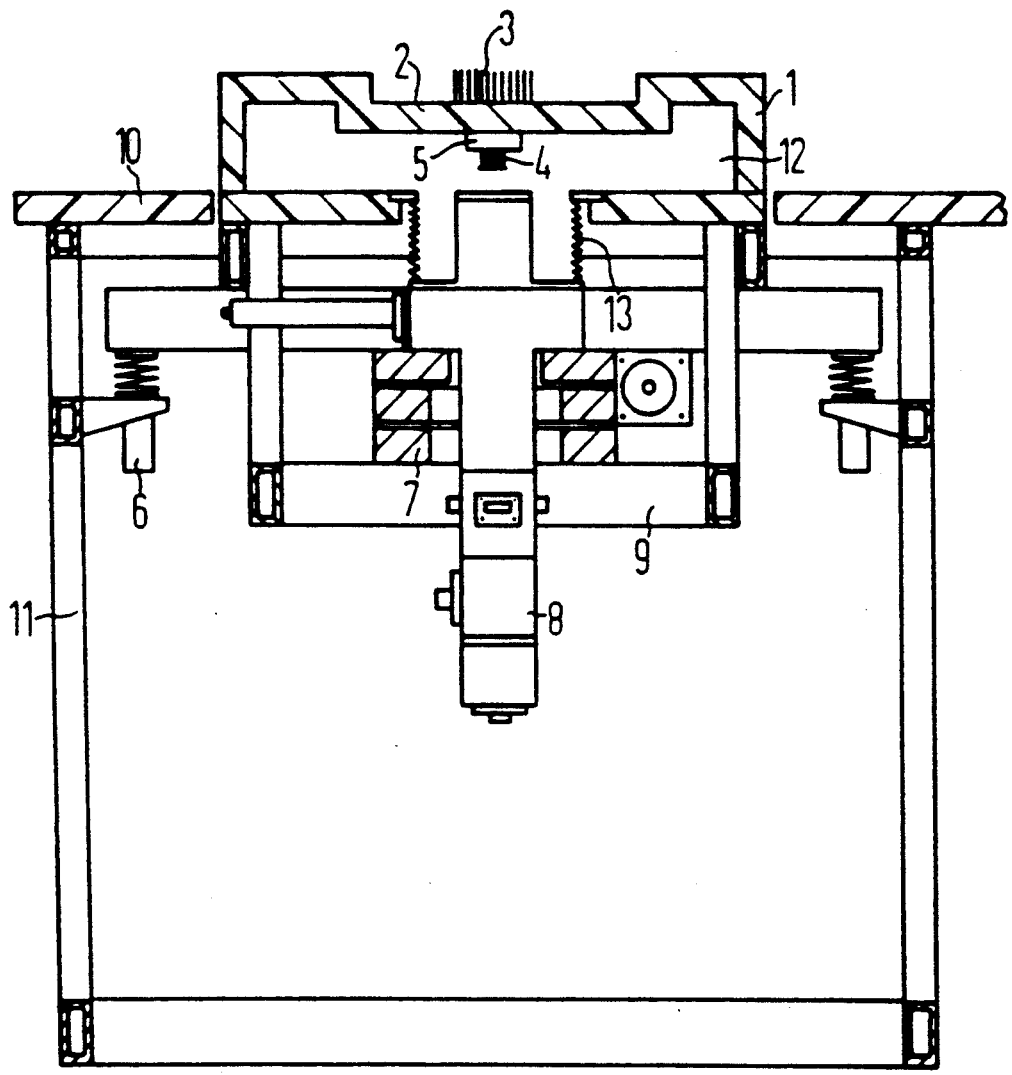
FIG. 1 illustrates an electron beam measuring instrument according to the prior art and in which a component which is to be measured is located, the component radiating heat.

The cover hood 2 of the electron beam measuring instrument has its upper side provided with an opening through which the heat sink 14 designed as a cooling die projects into the inside of the vacuum chamber 12. The cooling ribs 16 of the heat sink 14 are situated outside the vacuum chamber and are rigidly joined to the heat sink. Temperature-controlled cooling air 19 is blown onto the cooling ribs 16. The actual value for the temperature control is generated by the temperature sensor 15 that is brought through a bore in the heat sink 14 up to a point less than 1 mm from the cooled surface 22 of the component 4. The signal leads are structured to be offset laterally from the cooling die.

The sealing vis-a-vis the vacuum chamber 12 occurs via an electrically insulating ring 17 and via the seals 18 correspondingly introduced into the grooves 20 of the ring 17. What the arrangement of the seals achieves is that the seal rings 18 are pressed harder, given an evacuated vacuum chamber 12. A further advantage of this solution is the low thermal inertia of the structure, this enabling a rapid change in temperature for detecting temperature-dependent faults.

As shown in FIG. 4, the die can thereby be adjusted in slope-dependent and height-dependent fashion. This adjustment occurs with a socket joint 23 providing inclination adjustment and that is attached to the under side of the heat sink 14. The end face 21 of the heat sink 14 can thereby be matched to the position of the contact surface 22 of the component 4. An automatic matching to different heights between cooling die and component 4 can be achieved by employing the resilient connection 24 in the inside of the heat sink 14. As shown in FIG. 4, the resilient connect 24 is a spring within a hollow interior facing a lower end of the heat sink 14 which biases a telescopically received inner member so that the end face 21 is matched to the position of the contact surface 22. The sealing vis-a-vis the vacuum chamber 12 again occurs via the insulating ring 17 and the seals 18, whereby an additional, rough height adjustment can already occur on the basis of the height of the insulating ring 17. Appropriately adapted, the above-described cooling means can also be employed given other units under test such as, for example, printed circuit boards.

Although various minor changes and modifications might be proposed by those skilled in the art, it will be understood that we wish to include within the claims of the patent warranted hereon all such changes and modifications as reasonably come within our contribution to the art.

We claim as our invention:

1. A cooling system for a heat generating component situated in a vacuum chamber for function testing with focused electron or ion beams, comprising:

at an upper side of the vacuum chamber an opening being provided;

an elongated low thermal resistance heat sink having a lower end designed as a mounting surface to which the component is mounted in thermal low resistance contact, and an upper end projecting up through the opening above the upper side of the vacuum chamber;

the upper end of the heat sink being connected to a relatively large area heat sink having cooling ribs and positioned above the upper side of the vacuum chamber;

sealing means connecting the relatively large area heat sink to the vacuum chamber upper side so that the opening of the vacuum chamber is effectively sealed;

means being provided for blowing temperature-controlled cooling air at the cooling ribs for elimination of heat; and a temperature sensor means, which is guided through a bore in the heat sink and which is brought up to a point less than 1 mm from a surface of the component to be cooled, being provided for deriving an actual value for temperature control for said component.

2. A cooling means according to claim 1 wherein said sealing means comprises a circular insulated ring sandwiched between the upper side of the vacuum chamber and a lower surface of the relatively large heat sink having cooling ribs.

3. A cooling means according to claim 2 wherein said insulated ring has a groove facing said upper side of the vacuum chamber and a groove facing said lower surface of said relatively large-area heat sink, and respective seals being received in said grooves.

4. A cooling means according to claim 1 wherein said relatively large-area heat sink comprises a flat plate having said cooling ribs extending upwardly therefrom.

5. A cooling means according to claim 1 wherein said heat sink has at said lower end means for adjusting inclination of said mounting surface to which the component is mounted.

6. A cooling means according to claim 1 wherein said heat sink facing said lower end comprises an outer member containing a telescoping inner member, the telescoping inner member being spring biased for lengthening the heat sink depending on positioning of the component within the vacuum chamber.

* * * * *

UNITED STATES PATENT AND TRADEMARK OFFICE
CERTIFICATE OF CORRECTION

PATENT NO. : 5,210,424
DATED      : May 11, 1993
INVENTOR(S): Friedbert Gelzer and Volker Wuerttenberger It is certified that error appears in the above-indentified patent and that said Letters Patent is hereby corrected as shown below:

Cover page, column 2, before "[57] ABSTRACT", insert the following:

--Attorney, Agent or Firm — Hill, Steadman & Simpson--.

Signed and Sealed this

Twenty-ninth Day of March, 1994

Attest:

BRUCE LEHMAN

*Attesting Officer*   *Commissioner of Patents and Trademarks*